United States Patent
Yagi et al.

(10) Patent No.: US 8,125,651 B2
(45) Date of Patent: Feb. 28, 2012

(54) SUBSTRATE DETECTION DEVICE AND SUBSTRATE CONVEYANCE APPARATUS

(75) Inventors: Shuzo Yagi, Saga (JP); Masao Nakane, Fukuoka (JP); Yoshinori Isobata, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/864,785

(22) PCT Filed: Jan. 14, 2009

(86) PCT No.: PCT/JP2009/000115
§ 371 (c)(1),
(2), (4) Date: Jul. 27, 2010

(87) PCT Pub. No.: WO2009/096142
PCT Pub. Date: Aug. 6, 2009

(65) Prior Publication Data
US 2010/0309484 A1      Dec. 9, 2010

(30) Foreign Application Priority Data

Jan. 28, 2008  (JP) .................................. 2008-016114

(51) Int. Cl.
*G01B 11/14* (2006.01)
(52) U.S. Cl. .................. 356/614; 356/237.1; 356/237.6; 250/559.22; 250/559.3
(58) Field of Classification Search .... 356/237.1–237.6, 356/614; 250/559.22, 559.3
See application file for complete search history.

(56) References Cited

U.S. PATENT DOCUMENTS
4,844,758 A * 7/1989 Hamamura et al. ............ 156/64
(Continued)

FOREIGN PATENT DOCUMENTS
EP   0179735 A2   4/1986
(Continued)

OTHER PUBLICATIONS
International Search Report for PCT/JP2009/000115 dated Feb. 17, 2009.

*Primary Examiner* — Gregory J Toatley
*Assistant Examiner* — Iyabo S Alli
(74) *Attorney, Agent, or Firm* — Pearne & Gordon LLP

(57) ABSTRACT

An object is to provide a substrate conveyance apparatus and a substrate detection device capable of improving flexibility in arrangement layout.

The substrate detection device includes a projector 41 for projecting inspection light 40 so as to pass through a predetermined position on a path of a substrate 4 conveyed by conveyance belts 26, a light receiver 42 for receiving the inspection light 40 projected by the projector 41, and a detector (a control device 15) for detecting that the substrate 4 reaches the predetermined position based on a decrease in the amount of received light of the inspection light 40 received by the light receiver 42 when the substrate 4 conveyed by the conveyance belts 26 reaches the predetermined position and a portion of the inspection light 40 is blocked by the substrate 4. The inspection light 40 is projected from the projector 41 so as to include opposite ends of a width direction of the conveyance belts 26 in an optical path of the inspection light in a direction orthogonal to a conveyance direction of the substrate 4 conveyed by the conveyance belts 26 and the light receiver 42 receives the inspection light passing through upper and lower regions of the conveyance belts 26 in the width direction.

4 Claims, 6 Drawing Sheets

U.S. PATENT DOCUMENTS 6,677,605 B2 *  1/2004  Furue ............................ 250/584

FOREIGN PATENT DOCUMENTS

| JP | 61-101311 A |   | 5/1986 |
| JP | 62-11334 A |   | 8/1994 |
| JP | 6-286844 A |   | 10/1994 |
| JP | 9-189511 A |   | 7/1997 |
| JP | 409189511 A | * | 7/1997 |
| JP | 2003-174282 A |   | 6/2003 |
| JP | 2004-205361 A |   | 7/2004 |
| JP | 2005-119798 A |   | 5/2005 |
| JP | 2005-335920 A |   | 12/2005 |

* cited by examiner

SUBSTRATE DETECTION DEVICE AND SUBSTRATE CONVEYANCE APPARATUS

TECHNICAL FIELD

The present invention relates to a substrate detection device for detecting that a substrate conveyed by a substrate conveyance apparatus reaches a predetermined position, and the substrate conveyance apparatus including this substrate detection device.

BACKGROUND ART

In a substrate conveyance apparatus used in positioning and conveyance of a substrate in a part mounting apparatus, a screen printing apparatus, etc., both right and left ends of the substrate are placed on upper surfaces of a pair of right and left conveyance belts and the substrate is conveyed. In such a substrate conveyance apparatus, a substrate detection device for detecting that the conveyed substrate reaches a predetermined position is disposed and when this substrate detection device detects that the substrate reaches the predetermined position, control of stopping or decreasing a conveyance speed of the substrate is performed. The substrate detection device includes a projector for projecting inspection light and a light receiver for receiving the inspection light projected from this projector, and detects that the substrate reaches the predetermined position based on a decrease in the amount of received light of the inspection light received by the light receiver when the inspection light is blocked by the substrate conveyed by the substrate conveyance apparatus.

Also, an apparatus constructed so that a substrate can be detected by reflecting inspection light by an inner wall of a hole even when the inspection light is projected in an oblique direction rather than a vertical direction and the inspection light enters the hole since the substrate cannot be detected in a situation in which the inspection light just passes through a hole (for example, a hole for recognizing a position of the substrate or a screw hole for fixing the substrate) disposed in the substrate in a position in which the substrate wants to be detected has been known (Patent Reference 1).
Patent Reference 1: JP-A-6-211334

DISCLOSURE OF THE INVENTION

Problems that the Invention is to Solve

However, in the apparatus for projecting the inspection light in the vertical direction of the substrate as described above (also including the apparatus for projecting the inspection light in the oblique direction as described in Patent Reference 1), it was necessary to pass the inspection light between the right and left conveyance belts and there was a drawback of having low flexibility in arrangement layout of the projector and the light receiver.

Therefore, an object of the invention is to provide a substrate conveyance apparatus and a substrate detection device capable of improving flexibility in arrangement layout.

Means for Solving the Problems

A substrate detection device according to a first aspect of the invention includes a projector for projecting inspection light so as to pass through a predetermined position on a path of a substrate conveyed by a conveyance belt, a light receiver for receiving the inspection light projected by the projector, and a detector for detecting that the substrate reaches the predetermined position based on a decrease in the amount of received light of the inspection light received by the light receiver when the substrate conveyed by the conveyance belt reaches the predetermined position and a portion of the inspection light is blocked by the substrate, and the inspection light is projected from the projector so as to include opposite ends of a width direction of the conveyance belt in an optical path of the inspection light in a direction orthogonal to a conveyance direction of the substrate conveyed by the conveyance belt and the light receiver receives the inspection light passing through upper and lower regions of the conveyance belt.

A substrate conveyance apparatus according to a second aspect of the invention is the substrate conveyance apparatus for conveying a substrate by a conveyance belt, and includes the two substrate detection devices of the first aspect described above, and a projector and a light receiver had by each of the substrate detection devices are disposed in line in a conveyance direction of the substrate and a substrate conveyance controller for decreasing a conveyance speed of the substrate when the substrate is detected by one substrate detection device having the projector and the light receiver disposed on the near side of the conveyance direction of the substrate and stopping conveyance of the substrate when the substrate is detected by the other substrate detection device is included.

A substrate conveyance apparatus according to a third aspect of the invention is the substrate conveyance apparatus for conveying a substrate by a conveyance belt, and includes the plural substrate detection devices of the first aspect described above, and a projector and a light receiver had by each of the substrate detection devices are disposed in line in a conveyance direction of the substrate and a substrate position detector for detecting a position of the substrate based on information as to whether or not each of the substrate detection devices detects the substrate is included.

Advantage of the Invention

The substrate detection device of the invention is constructed so that the inspection light is projected from the projector so as to include opposite ends of the width direction of the conveyance belt in the optical path of the inspection light (that is, so as to stride over the conveyance belt in the thickness direction) in the direction orthogonal to the conveyance direction conveyed by the conveyance belt and the light receiver receives the inspection light passing through the upper and lower regions of the conveyance belt, so that there is no restriction of having to pass the inspection light between the right and left conveyance belts as described in the conventional art, and flexibility in arrangement layout of the projector and the light receiver can be improved. Also, the inspection light is projected and received so as to include opposite ends of the width direction of the conveyance belts in the optical path, so that the substrate can be detected with high accuracy even when the conveyance belts move vertically (vibrate minutely) and also a thickness of the substrate is extremely thin. Also, the substrate conveyance apparatus of the invention includes the substrate detection device of the invention described above, so that the decrease in the conveyance speed of the substrate, stop control or position detection of the substrate can be performed with extremely high accuracy.

DESCRIPTION OF REFERENCE NUMERALS AND SIGNS

3 SUBSTRATE CONVEYANCE APPARATUS
4 SUBSTRATE
15 CONTROL DEVICE (DETECTOR, SUBSTRATE CONVEYANCE CONTROLLER, SUBSTRATE POSITION DETECTOR)
21 SUBSTRATE DETECTION DEVICE
26 CONVEYANCE BELT
40 INSPECTION LIGHT
41 PROJECTOR
42 LIGHT RECEIVER

BEST MODE FOR CARRYING OUT THE INVENTION

Figure 1:
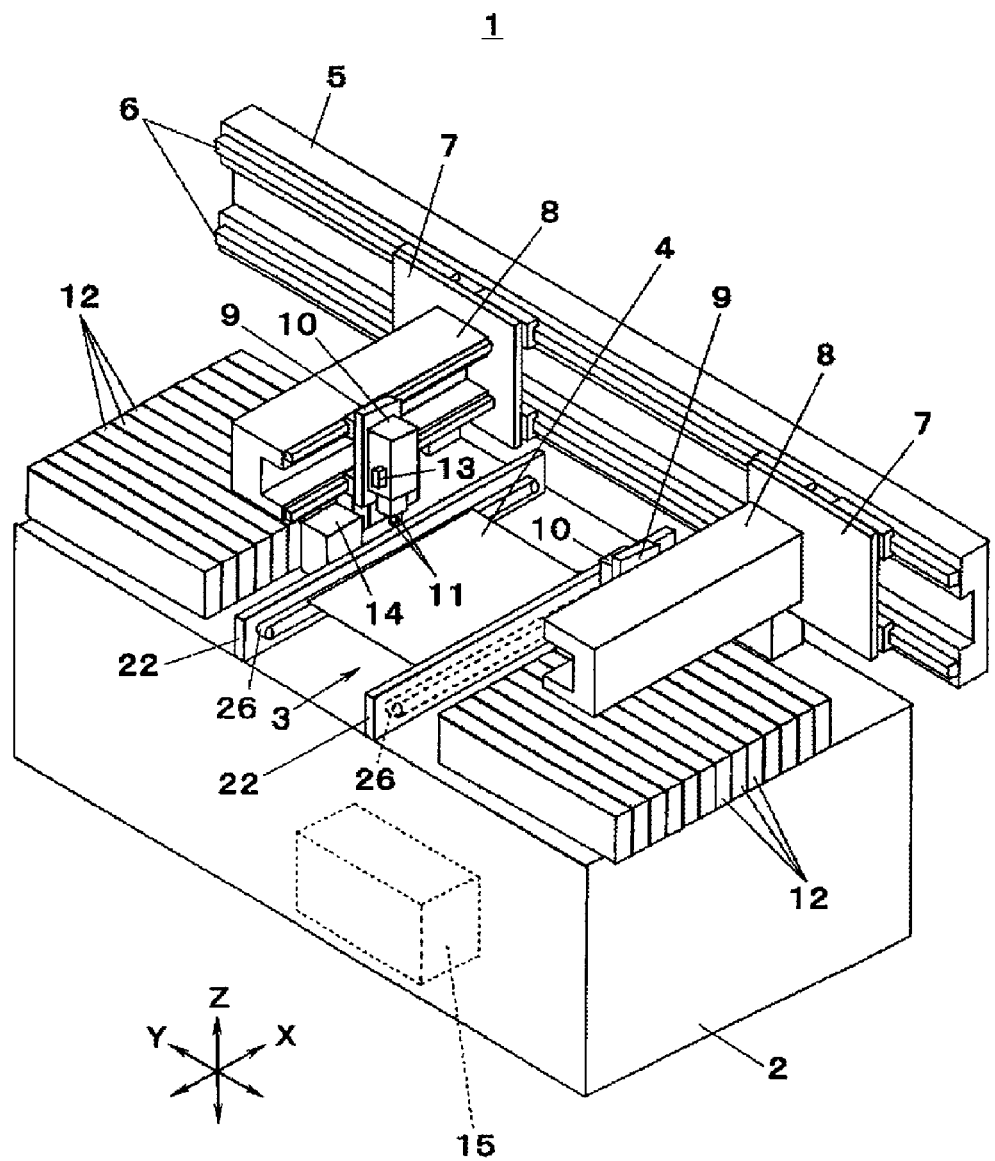
FIG. 1 is a perspective view of a part mounting apparatus in one embodiment of the invention.
Figure 2:
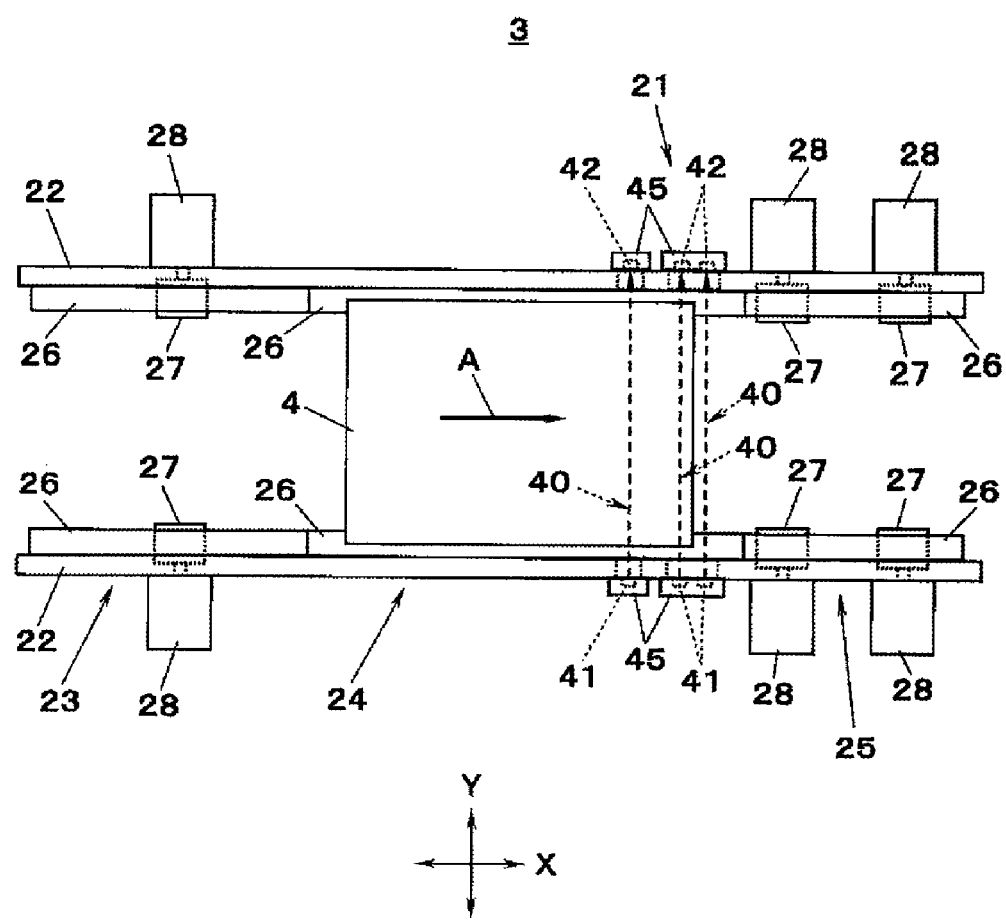
FIG. 2 is a plan view of a substrate conveyance apparatus in one embodiment of the invention.
Figure 3:
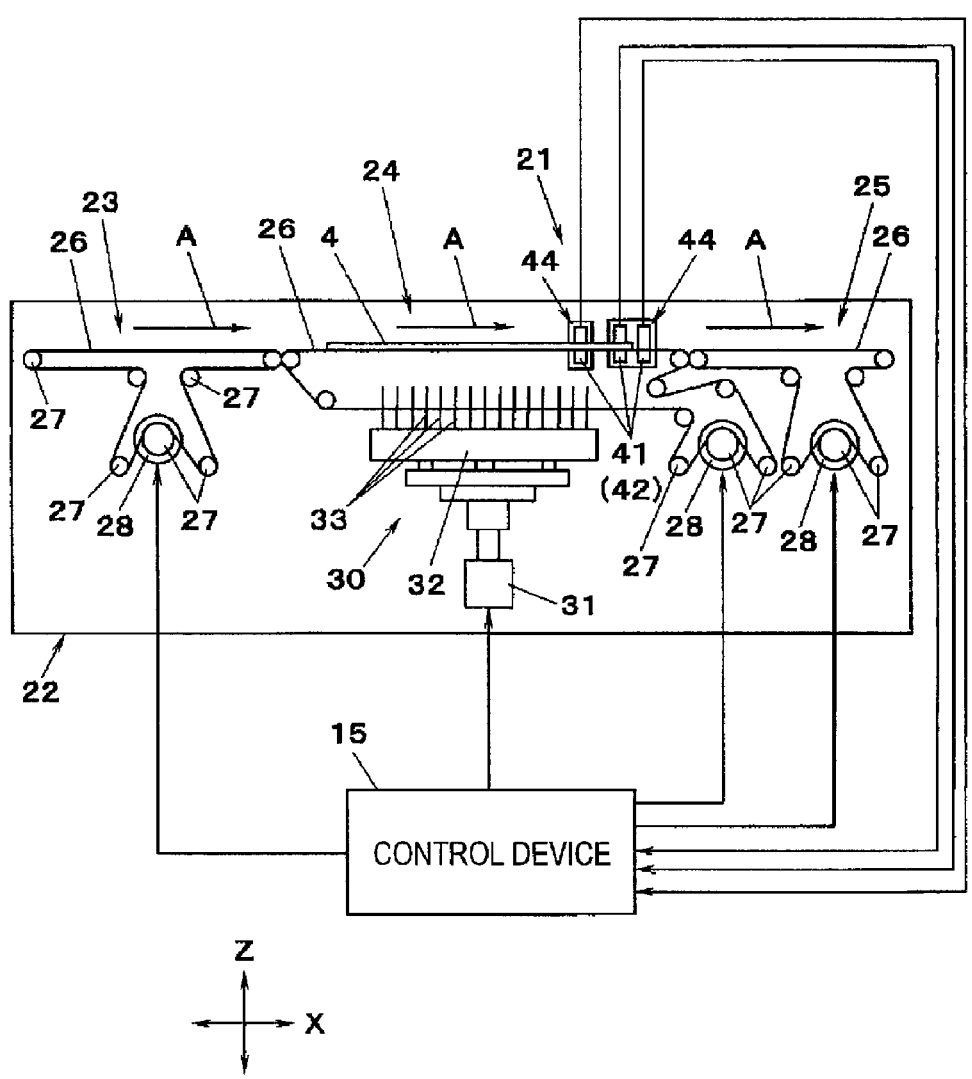
FIG. 3 is a side view of the substrate conveyance apparatus in one embodiment of the invention.
Figure 4:
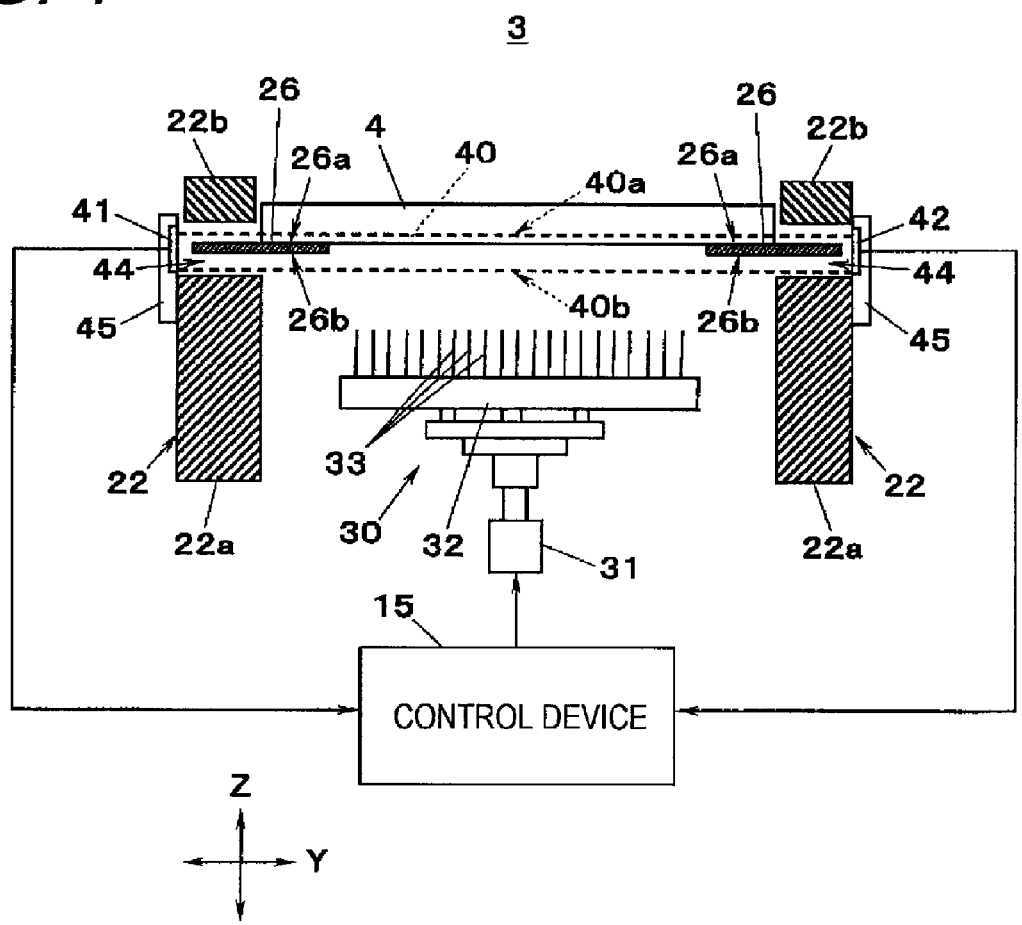
FIG. 4 is a sectional front view of the substrate conveyance apparatus in one embodiment of the invention.
Figure 5:
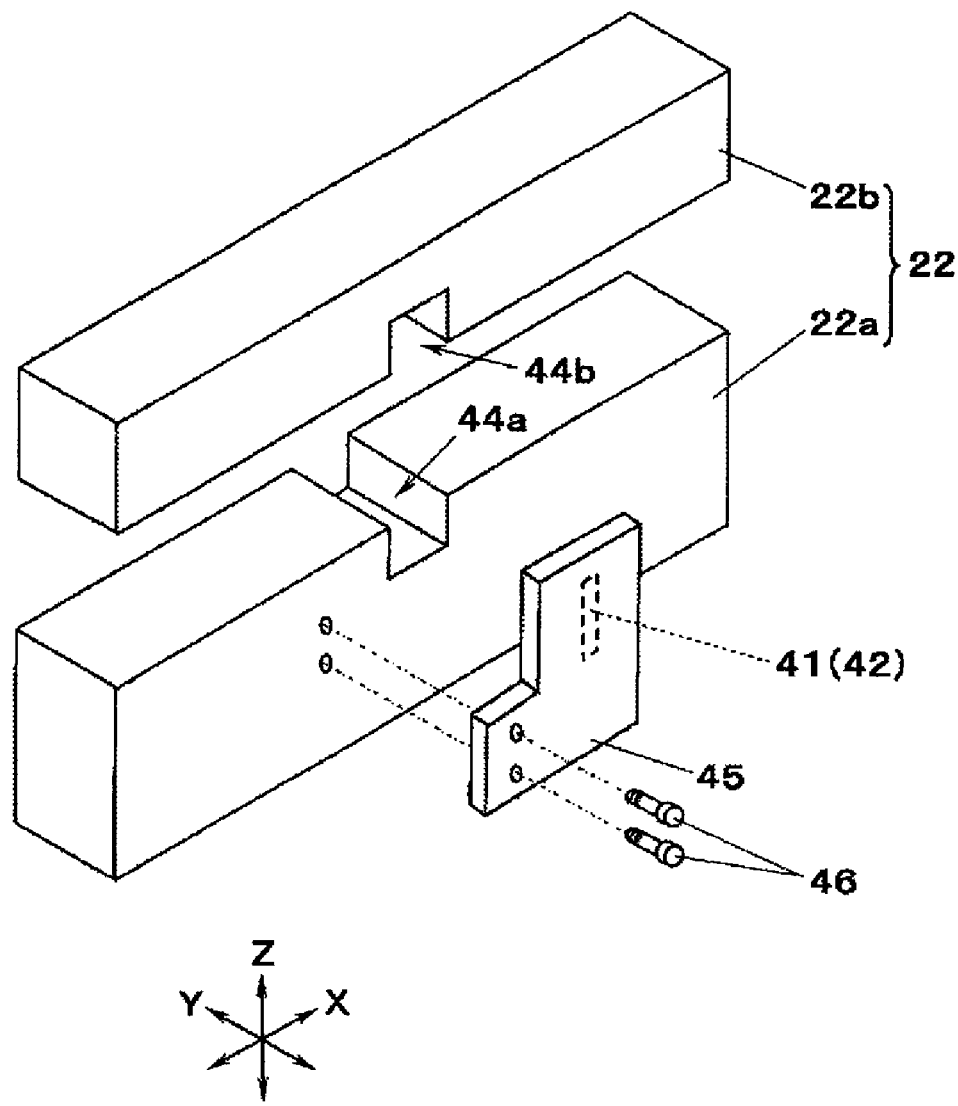
FIG. 5 is a partially exploded perspective view of the substrate conveyance apparatus in one embodiment of the invention.

An embodiment of the invention will hereinafter be described with reference to the drawings. FIG. 1 is a perspective view of a part mounting apparatus in one embodiment of the invention, and FIG. 2 is a plan view of a substrate conveyance apparatus in one embodiment of the invention, and FIG. 3 is a side view of the substrate conveyance apparatus in one embodiment of the invention, and FIG. 4 is a sectional front view of the substrate conveyance apparatus in one embodiment of the invention, and FIG. 5 is a partially exploded perspective view of the substrate conveyance apparatus in one embodiment of the invention, and FIGS. 6(a), 6(b), 6(c) and 6(d) are diagrams showing a positional relation between a substrate and optical sensors included by a substrate detection device in one embodiment of the invention.

In FIG. 1, a part mounting apparatus 1 includes a substrate conveyance apparatus 3 in one embodiment of the invention on a base 2, and a substrate 4 is conveyed by this substrate conveyance apparatus 3 in one direction (X-axis direction) of the inside of a horizontal plane. The substrate conveyance apparatus 3 extends on the base 2 in the X-axis direction, and a Y-axis table 5 extending in a direction (Y-axis direction) horizontally orthogonal to the X-axis direction is disposed over the substrate conveyance apparatus 3. Two parallel slide guides 6 extending in the Y-axis direction are disposed in a side surface of the Y-axis table 5, and two Y-axis sliders 7 are disposed movably along the slide guides 6 (that is, in the Y-axis direction) in these two slide guides 6. One end of an X-axis table 8 extending in the X-axis direction is attached to each of the Y-axis sliders 7, and a movement stage 9 movable along the X-axis table 8 (that is, in the X-axis direction) is disposed in each of the X-axis tables 8.

A transfer head 10 is attached to each of the movement stages 9, and plural suction nozzles 11 extending under a vertical direction (Z-axis direction) are disposed in each of the transfer heads 10. Plural part feeders 12 for feeding parts to the transfer head 10 are disposed in line in the X-axis direction in a lateral region of the substrate conveyance apparatus 3. A substrate camera 13 whose imaging area is downward turned is disposed in the transfer head 10, and a part camera 14 whose imaging area is upward turned is disposed on the base 2.

The substrate conveyance apparatus 3 positions the substrate 4 in a predetermined mounting work position after the substrate 4 is conveyed in the X-axis direction. The movement stages 9 move relatively to the substrate 4 positioned in the mounting work position by movement in the Y-axis direction of the X-axis tables 8 and movement in the X-axis direction of the movement stages 9 themselves, and make the substrate camera 13 located over the substrate 4 perform image recognition (imaging) of a positioning mark (not shown) of the substrate 4, and thereafter pick up a part fed by the part feeders 12 by the suction nozzles 11 included by the transfer heads 10. Then, the part sucked by the suction nozzles 11 moves in the horizontal direction so as to pass through the upper portion of the part camera 14 (the inside of a visual field of the part camera 14) and the part camera 14 is made to perform image recognition (imaging) of a lower surface of the part and then, the part sucked by the suction nozzles 11 is installed on the substrate 4 based on installation position data given to its part. At this time, a position deviation of the substrate 4 obtained by the image recognition of the substrate camera 13 and a suction deviation of the part to the suction nozzles 11 obtained by the image recognition of the part camera 14 are corrected and the part is installed in a proper position on the substrate 4.

Next, the substrate conveyance apparatus 3 included in this part mounting apparatus 1 will be described. The substrate conveyance apparatus 3 includes right and left conveyor basal portions 22 (also see FIG. 1) extending in the X-axis direction disposed on the base 2 and conveyor mechanisms attached to these right and left conveyor basal portions 22 as shown in FIGS. 2 and 3. The conveyor mechanisms include a backward conveyor mechanism 23 located in the most upstream side with reference to a conveyance direction of the substrate 4, a center conveyor mechanism 24 located in the downstream side of the backward conveyor mechanism 23, and a forward conveyor mechanism 25 located in the downstream side of the center conveyor mechanism 24.

In FIGS. 2 and 3, the three conveyor mechanisms (the backward conveyor mechanism 23, the center conveyor mechanism 24 and the forward conveyor mechanism 25) respectively have right and left conveyance belts 26, and each of the conveyance belts 26 is wound on plural pulleys 27 disposed in the right and left conveyor basal portions 22. A rotational shaft of a conveyance driving motor 28 fixed in the right and left conveyor basal portions 22 is coupled to one of the plural pulleys 27 on which each of the conveyance belts 26 is wound, and these conveyance driving motors 28 are driven from a control device 15 disposed inside the base 2 and thereby, each of the conveyance belts 26 can be fed in a direction of arrow A shown in FIGS. 2 and 3. When the right and left ends of the substrate 4 are placed on upper surfaces of a pair of the right and left conveyance belts 26 respectively included by the backward conveyor mechanism 23, the center conveyor mechanism 24 and the forward conveyor mechanism 25 at this time, its substrate 4 is conveyed in the direction of arrow A by a feeding operation of the conveyance belts 26 and is received and passed in order of the backward conveyor mechanism 23, the center conveyor mechanism 24 and the forward conveyor mechanism 25 and moves on a conveyance path of the substrate 4 from the back to the front.

In FIGS. 3 and 4, a substrate ascending and descending mechanism 30 is disposed in the center of the center conveyor mechanism 24. This substrate ascending and descending mechanism 30 includes an ascending and descending motor 31 actuated and controlled by the control device 15, an ascending and descending block 32 ascended and descended by this ascending and descending motor 31, and multiple pin members 33 disposed upward extending from an upper surface of the ascending and descending block 32, and when the ascending and descending motor 31 is actuated from the control device 15 in a state in which the substrate 4 conveyed by the center conveyor mechanism 24 is stopped (positioned) in the mounting work position of the upper portion of the ascending and descending block 32 and the ascending and descending block 32 is ascended and the substrate 4 is pushed up from the lower portion by the multiple pin members 33, the substrate 4 positioned in the mounting work position can be lifted and supported in a state of floating the substrate 4 upward from the right and left conveyance belts 26 of the center conveyor mechanism 24.

Next, a substrate detection device 21 included in this substrate conveyance apparatus 3 will be described. In FIGS. 2 and 3, the substrate detection device 21 includes a projector 41 for projecting inspection light 40 so as to pass through a predetermined position (this predetermined position is preset as a position in which the substrate 4 wants to be detected) on the path of the substrate 4 conveyed by a pair of the right and left conveyance belts 26 included in the substrate conveyance apparatus 3, a light receiver 42 for receiving the inspection light 40 projected by this projector 41, and the control device 15 as a detector for detecting that the substrate 4 reaches the predetermined position based on a decrease in the amount of received light of the inspection light 40 received by the light receiver 42 when the substrate 4 conveyed by the conveyance belts 26 reaches the predetermined position and a portion of the inspection light 40 is blocked by the substrate 4.

The projector 41 and the light receiver 42 are fixed to the right and left conveyor basal portions 22 which are immovable portions of the substrate conveyance apparatus 3, and the inspection light 40 is projected from the projector 41 so as to include opposite ends of a width direction of the conveyance belts 26 in an optical path of the inspection light 40 (so as to stride over the conveyance belts 26 in the thickness direction) in a direction (Y-axis direction) orthogonal to the conveyance direction (X-axis direction) of the substrate 4 conveyed by a pair of the right and left conveyance belts 26, and the light receiver 42 receives the inspection light 40 passing through upper and lower regions of the conveyance belts 26 in the width direction (Y-axis direction). That is, in FIG. 4, it is constructed so that the upper edge 40a of the inspection light 40 is located upward from upper surfaces 26a of the right and left conveyance belts 26 and the lower edge 40b of the inspection light 40 is located downward from lower surfaces 26b of the right and left conveyance belts 26.

In FIG. 5, each of the right and left conveyor basal portions 22 is respectively made by joining a lower member 22a to an upper member 22b in the vertical direction and in a state of joining the lower member 22a to the upper member 22b, a lower side notch 44a formed in the lower member 22a with the notch 44a opened upward is vertically combined with an upper side notch 44b formed in the upper member 22b with the notch 44b opened downward and a passage 44 of the inspection light 40 is formed (see FIG. 4). A sensor attachment member 45 is attached to the lower member 22a joined to the upper member 22b by attachment screws 46, and the projector 41 or the light receiver 42 is fixed to this sensor attachment member 45. A projection surface of the projector 41 and an acceptance surface of the light receiver 42 are exposed through the passage 44 formed in the conveyor basal portions 22 and are opposed in the horizontal direction.

The inspection light 40 projected by the projector 41 is received by the light receiver 42, and the inspection light 40 is projected from the projector 41 so as to include opposite ends of the width direction of the conveyance belts 26 in the optical path (so as to stride over the conveyance belts 26 in the thickness direction) as described above, so that the conveyance belts 26 are present in the optical path of the inspection light 40 and the amount of received light of the inspection light 40 by the light receiver 42 becomes a value always lower than that of the case where the conveyance belts 26 are not present in the optical path of the inspection light 40. However, when a portion of the inspection light 40 is blocked by only the conveyance belts 26, the amount of the blocked light is constant, so that the amount of received light of the inspection light 40 received by the light receiver 42 is constant regardless of time as long as the substrate 4 conveyed by the conveyance belts 26 enters the inside of the optical path of the inspection light 40 and a portion of the inspection light 40 is not blocked.

When the substrate 4 conveyed by the conveyance belts 26 reaches the predetermined position described above and a portion of the inspection light 40 is blocked herein, the amount of received light of the inspection light 40 received by the light receiver 42 decreases by the amount (the amount blocked by the substrate 4), so that the amount of received light of the inspection light 40 received by the light receiver 42 decreases and the control device 15 can detect that the substrate 4 reaches the predetermined position based on that decrease.

The substrate conveyance apparatus 3 includes such three substrate detection devices 21 inside a conveyance region of the substrate 4 by the center conveyor mechanism 24 and also includes the control device 15 as a substrate conveyance controller and a substrate position detector (the control device 15 as the detector is common) as shown in FIGS. 2 and 3. For convenience sake in the following explanation, the projector 41 and the light receiver 42 are collectively called an optical sensor and also the optical sensor located in the most upstream side of the inside of the conveyance region of the center conveyor mechanism 24 of the three optical sensors disposed in line in the conveyance direction (X-axis direction) of the substrate 4 is called a first optical sensor 43a and the optical sensor located in the downstream side of the first optical sensor 43a is called a second optical sensor 43b and the optical sensor located in the downstream side of the second optical sensor 43b is called a third optical sensor 43c (FIGS. 6(a), 6(b), 6(c) and 6(d)).

The projector 41 of the first optical sensor 43a projects the inspection light 40 so as to pass through a first predetermined position on a path of the substrate 4, and the projector 41 of the second optical sensor 43b projects the inspection light so as to pass through a second predetermined position on the path of the substrate 4, and the projector 41 of the third optical sensor 43c projects the inspection light so as to pass through a third predetermined position on the path of the substrate 4. Here, the first predetermined position is set in a position to start a decrease (slowdown) in conveyance speed of the substrate 4 at the time when the substrate 4 conveyed by the conveyance belts 26 reaches its position, and the second predetermined position is set in a position to stop conveyance of the substrate 4 at the time when the substrate 4 conveyed by the conveyance belts 26 reaches its position. Also, the third predetermined position is set in a position which the top (head) of the stopped substrate 4 must not be reached after the substrate 4 conveyed by the conveyance belts 26 reaches the second predetermined position and conveyance of the substrate 4 is stopped.

Here, the second predetermined position and the third predetermined position are set in the extremely close position, so that the projector 41 constructing the second optical sensor 43b and the projector 41 constructing the third optical sensor 43c, and the light receiver 42 constructing the second optical sensor 43b and the light receiver 42 constructing the third optical sensor 43c are respectively attached to the same sensor attachment member 45 (FIG. 2).

Figure 6:
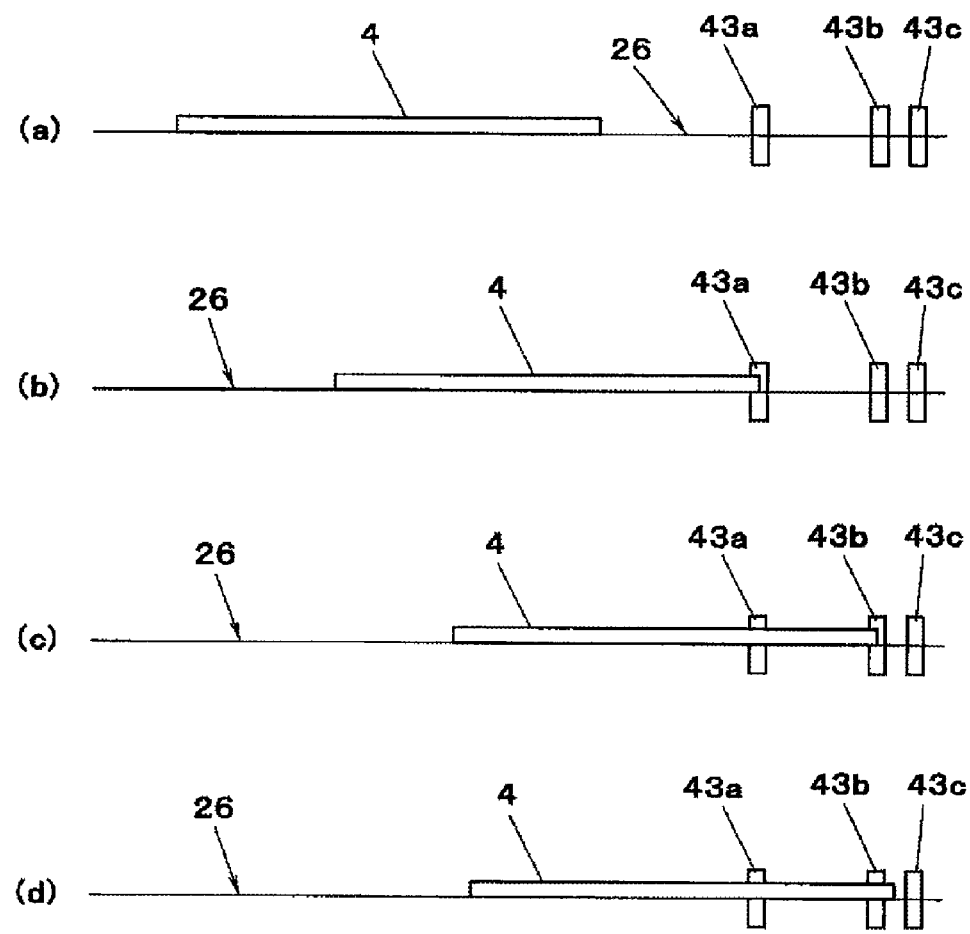
FIGS. 6(a), 6(b), 6(c) and 6(d) are diagrams showing a positional relation between a substrate and optical sensors included by a substrate detection device in one embodiment of the invention.

In the substrate conveyance apparatus 3 including the three substrate detection devices 21 thus, when the top (head) of the substrate 4 conveyed by the center conveyor mechanism 24 approaches a position in which a portion of the inspection light 40 projected by the projector 41 of the first optical sensor 43a is blocked (FIG. 6(a)→FIG. 6(b)), the control device 15 as the detector detects that the substrate 4 reaches the first predetermined position, that is, the position to start the decrease (slowdown) in conveyance speed of the substrate 4 based on the decrease in the amount of received light of the inspection light 40 received by the light receiver 42 of the first optical sensor 43a, and the control device 15 as the substrate conveyance controller performs actuation control of the conveyance driving motor 28 so as to decrease the conveyance speed of the substrate 4.

After the decrease in conveyance speed of the substrate 4 is started in this manner, when the top of the substrate 4 then approaches a position in which a portion of the inspection light 40 projected by the projector 41 of the second optical sensor 43b is blocked (FIG. 6(b)→FIG. 6(c)), the control device 15 as the detector detects that the substrate 4 reaches the second predetermined position, that is, the position to stop conveyance of the substrate 4 based on the decrease in the amount of received light of the inspection light 40 received by the light receiver 42 of the second optical sensor 43b, and the control device 15 as the substrate conveyance controller performs actuation control of the conveyance driving motor 28 so as to stop the conveyance of the substrate 4. Consequently, the substrate 4 conveyed by the center conveyor mechanism 24 is stopped in a position in which the second predetermined position is passed in front slightly.

After the conveyance of the substrate 4 is stopped in this manner, the control device 15 as the substrate position detector detects a position of the substrate 4 based on information as to whether or not each of the second optical sensor 43b and the third optical sensor 43c detects the substrate 4, and checks that the substrate 4 is stopped in a proper position. Concretely, the control device 15 reveals that the top of the substrate 4 is located in the second predetermined position and the third predetermined position when the second optical sensor 43b detects the substrate 4 and the third optical sensor 43c does not detect the substrate 4, so that the control device 15 can decide that the substrate 4 is stopped in the proper position (FIG. 6(d)). On the other hand, when both of the second optical sensor 43b and the third optical sensor 43c detect the substrate 4, it is decided that the substrate 4 is not stopped in the proper position, and predetermined measures to, for example, correct a position of the substrate 4 are taken.

Thus, the substrate conveyance apparatus 3 in the embodiment includes the substrate detection device 21 having the first optical sensor 43a, the substrate detection device 21 having the second optical sensor 43b, and the control device 15 as the substrate conveyance controller, and is constructed so that a conveyance speed of the substrate 4 is decreased when the substrate 4 is detected by one substrate detection device 21 (the substrate detection device 21 having the first optical sensor 43a) including the optical sensors (the projector 41 and the light receiver 42) on the near side of the conveyance direction of the substrate 4 and conveyance of the substrate 4 is stopped when the substrate 4 is detected by the other substrate detection device 21 (the substrate detection device 21 having the second optical sensor 43b).

Also, the substrate conveyance apparatus 3 in the embodiment includes the substrate detection device 21 having the second optical sensor 43b, the substrate detection device 21 having the third optical sensor 43c, and the control device 15 as the substrate position detector, and is constructed so that a position of the substrate 4 is detected based on information as to whether or not each of the substrate detection devices 21 detects the substrate 4.

As described above, the substrate detection device 21 in the embodiment includes the projector 41 for projecting the inspection light 40 so as to pass through a predetermined position on a path of the substrate 4 conveyed by the conveyance belts 26, the light receiver 42 for receiving the inspection light 40 projected by the projector 41, and the detector (the control device 15) for detecting that the substrate 4 reaches the predetermined position based on a decrease in the amount of received light of the inspection light 40 received by the light receiver 42 when the substrate 4 conveyed by the conveyance belts 26 reaches the predetermined position and a portion of the inspection light 40 is blocked by the substrate 4. Then, it is constructed so that the inspection light 40 is projected from the projector 41 so as to include opposite ends of a width direction of the conveyance belts 26 in an optical path of the inspection light in a direction orthogonal to the conveyance direction conveyed by the conveyance belts 26 and the light receiver 42 receives the inspection light 40 passing through upper and lower regions of the conveyance belts 26 in the width direction of the conveyance belts 26. As a result of this, there is no restriction of having to pass the inspection light 40 between the right and left conveyance belts 26 as described in the conventional art, and flexibility in arrangement layout of the projector 41 and the light receiver 42 can be improved.

Also, the inspection light 40 is projected and received so as to include opposite ends of the width direction of the conveyance belts 26, so that the substrate 4 can be detected with high accuracy even when the conveyance belts 26 move vertically (vibrate minutely) and also a thickness of the substrate 4 is extremely thin.

Also, the substrate conveyance apparatus 3 in the embodiment includes the substrate detection device 21 of the configuration described above, so that the decrease in the conveyance speed of the substrate 4, stop control or position detection of the substrate can be performed with extremely high accuracy.

The embodiment of the invention has been described heretofore, but the invention is not limited to the embodiment described above. For example, the embodiment described above has been constructed so that the substrate detection device 21 is disposed in only the one conveyance region (the center conveyor mechanism 24) of the plural conveyor mechanisms, but this is one example and it may be constructed so that the substrate detection device 21 is disposed within the conveyance region of each of the conveyor mechanisms when there are plural conveyor mechanisms.

In addition, the invention intends that persons skilled in the art make various changes and applications based on the well-known art and mention of the description without departing from the spirit and scope of the invention, and the changes and applications are included in the scope of protection.

The present application is based on Japanese patent application (patent application No. 2008-016114) filed on Jan. 28, 2008, and the contents of the patent application are hereby incorporated by reference.

INDUSTRIAL APPLICABILITY

A substrate conveyance apparatus and a substrate detection device capable of improving flexibility in arrangement layout are provided.

The invention claimed is:

1. A substrate detection device including a projector for projecting inspection light so as to pass through a predetermined position on a path of a substrate conveyed by a conveyance belt, a light receiver for receiving the inspection light projected by the projector, and a detector for detecting that the substrate reaches the predetermined position based on a decrease in amount of received light of the inspection light received by the light receiver when the substrate conveyed by the conveyance belt reaches the predetermined position and a portion of the inspection light is blocked by the substrate, characterized in that the inspection light is projected from the projector so as to include opposite ends of a width direction of the conveyance belt in an optical path of the inspection light in a direction orthogonal to a conveyance direction of the substrate conveyed by the conveyance belt and the light receiver receives the inspection light passing through upper and lower regions of the conveyance belt.

2. A substrate conveyance apparatus for conveying a substrate by a conveyance belt, the apparatus including two substrate detection devices as claimed in claim 1, characterized in that a projector and a light receiver had by each of the substrate detection devices are disposed in line in a conveyance direction of the substrate and a substrate conveyance controller for decreasing a conveyance speed of the substrate when the substrate is detected by one substrate detection device having the projector and the light receiver disposed on the near side of the conveyance direction of the substrate and stopping conveyance of the substrate when the substrate is detected by the other substrate detection device is included.

3. A substrate conveyance apparatus for conveying a substrate by a conveyance belt, the apparatus including plural substrate detection devices as claimed in claim 1, characterized in that a projector and a light receiver had by each of the substrate detection devices are disposed in line in a conveyance direction of the substrate and a substrate position detector for detecting a position of the substrate based on information as to whether or not each of the substrate detection devices detects the substrate is included.

4. A substrate conveyance apparatus for conveying a substrate by a conveyance belt, the apparatus including two substrate detection devices as claimed in claim 1, characterized in that an upper edge of the inspection light is located above an upper surface of the conveyance belt and a lower edge of the inspection light is located below a lower surface of the conveyance belt.

* * * * *